United States Patent
Yoshioka et al.

(10) Patent No.: US 8,853,742 B2
(45) Date of Patent: Oct. 7, 2014

(54) SEMICONDUCTOR DEVICE HAVING NITRIDE LAYERS

(71) Applicant: Kabushiki Kaisha Toshiba, Tokyo (JP)

(72) Inventors: Akira Yoshioka, Kanagawa (JP); Yasunobu Saito, Tokyo (JP); Wataru Saito, Hyogo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/039,716

(22) Filed: Sep. 27, 2013

(65) Prior Publication Data

US 2014/0097505 A1  Apr. 10, 2014

Related U.S. Application Data

(63) Continuation of application No. 13/605,814, filed on Sep. 6, 2012, now Pat. No. 8,575,656.

(30) Foreign Application Priority Data

Mar. 26, 2012  (JP) ................................ 2012-070228

(51) Int. Cl.
*H01L 29/66* (2006.01)
*H01L 27/06* (2006.01)
(Continued)

(52) U.S. Cl.
CPC .......... *H01L 29/475* (2013.01); *H01L 27/0676* (2013.01); *H01L 29/78* (2013.01); *H01L 29/2003* (2013.01); *H01L 21/8252* (2013.01); *H01L 29/66462* (2013.01); *H01L 27/0688* (2013.01); *H01L 29/4175* (2013.01); *H01L 29/7787* (2013.01); *H01L 27/0727* (2013.01); *H01L 29/872* (2013.01); *H01L 27/0605* (2013.01)
USPC ........................................................ 257/192

(58) Field of Classification Search
CPC ..................... H01L 29/4175; H01L 29/66462; H01L 29/7787; H01L 29/872; H01L 29/78; H01L 29/475; H01L 29/2003; H01L 27/0605; H01L 27/0676; H01L 27/0727; H01L 27/0688
USPC ......................................... 257/192, 201, 410
See application file for complete search history.

(56) References Cited

U.S. PATENT DOCUMENTS 7,838,907 B2  11/2010  Shiraishi
7,932,539 B2   4/2011  Chen et al.
(Continued)

FOREIGN PATENT DOCUMENTS

JP  2001102565 A   4/2001
JP  2004342810 A  12/2004
(Continued)

OTHER PUBLICATIONS

Japanese Office Action dated May 27, 2014, filed in Japanese counterpart Application No. 2012-070228, 5 pages (with translation).

*Primary Examiner* — Nikolay Yushin
(74) *Attorney, Agent, or Firm* — Patterson & Sheridan, LLP

(57) ABSTRACT

According to one embodiment, a second nitride semiconductor layer is provided on a first nitride semiconductor layer and has a band gap wider than that of the first nitride semiconductor layer. A third nitride semiconductor layer is provided above the second nitride semiconductor layer. A fourth nitride semiconductor layer is provided on the third nitride semiconductor layer and has a band gap wider than that of the third nitride semiconductor layer. A fifth nitride semiconductor layer is provided between the second and the third nitride semiconductor layers. A first electrode contacts the second, the third and the fourth nitride semiconductor layers. A second electrode is provided on the fourth nitride semiconductor layer. A gate electrode is provided on a gate insulating layer between the first and the second electrodes. A third electrode is in contact with the second nitride semiconductor layer.

20 Claims, 7 Drawing Sheets

(51) Int. Cl.
  *H01L 29/78* (2006.01)
  *H01L 21/8252* (2006.01)
  *H01L 29/417* (2006.01)
  *H01L 29/47* (2006.01)
  *H01L 29/778* (2006.01)
  *H01L 27/07* (2006.01)
  *H01L 29/872* (2006.01)
  *H01L 29/20* (2006.01)

(56) References Cited

U.S. PATENT DOCUMENTS 7,973,335 B2   7/2011   Okamoto et al.

| | | |
|---|---|---|
| 2006/0081897 A1 | 4/2006 | Yoshida |
| 2007/0228422 A1 | 10/2007 | Suzuki et al. |
| 2009/0065787 A1 | 3/2009 | Kikkawa et al. |
| 2009/0166677 A1 | 7/2009 | Shibata et al. |
| 2010/0264462 A1 | 10/2010 | Hirler et al. |
| 2011/0186859 A1 | 8/2011 | Ohki |
| 2011/0227132 A1 | 9/2011 | Anda et al. |
| 2011/0260777 A1 | 10/2011 | Suzuki et al. |

FOREIGN PATENT DOCUMENTS

| | | |
|---|---|---|
| JP | 2007266475 A | 10/2007 |
| JP | 2007281497 A | 10/2007 |
| JP | 2008306200 A | 12/2008 |
| JP | 2009004398 A | 1/2009 |
| JP | 2009164158 A | 7/2009 |
| JP | 2010135640 A | 6/2010 |

SEMICONDUCTOR DEVICE HAVING NITRIDE LAYERS

CROSS-REFERENCE TO RELATED APPLICATION

This application is a continuation of U.S. patent application Ser. No. 13/605,814, filed on Sep. 6, 2012, which is based upon and claims the benefit of priority from Japanese Patent Application No. 2012-070228, filed on Mar. 26, 2012, the entire contents of which are incorporated herein by reference.

FIELD

Embodiments described herein relate generally to a semiconductor device having nitride layers.

BACKGROUND

With increase of emphasis on energy saving in recent years, high efficiency of a power conversion circuit is focused. The power conversion circuit converts a power of a form suitable for power generation and power transmission into a power of a form which can be used for power-consuming equipment easily. As the power conversion circuit, a switching power supply or an inverter is known, for example.

A device called as a power semiconductor device generally is used as a main device in a power conversion circuit. The power semiconductor device serves to control power supply to a load by a switching operation. Since a magnitude of loss in switching typically affects efficiency of a power conversion circuit significantly, research on high performance of a power semiconductor device is widely carried out. As a semiconductor material composing a power semiconductor device, silicon (Si) has been used for many years. However, the performance of a power semiconductor device is reaching a limit to which the performance is limited by the material properties of silicon.

A device which uses a new material such as silicon carbide (SiC) or a nitride semiconductor such as GaN in place of silicon has been developed for the purpose of exceeding the limit due to the material properties of silicon. The common features of such a new material are a wide band gap and large breakdown field strength, for example. Thus, in a case of employing SiC or GaN, it is possible to use a unipolar transistor having a fast switching speed even in a high voltage area in which a transistor other than a bipolar transistor can not be used when silicon is employed as a constituent material. As a result, it is possible to reduce loss which is produced in a switching operation of a power semiconductor device.

An energy saving effect is expected in a case of using such a new material in a diode as well as in a transistor. By the same reason as shown in the case of the transistor, it is possible to use a unipolar-type Schottky barrier diode (SBD) even in a high voltage area in which a diode other than a bipolar-type pn diode can not be used when silicon is employed as a constituent material. The SBD has a fast switching speed compared with the pn diode. Accordingly, it is possible to reduce switching loss and obtain a low-loss power conversion circuit.

A feature of the nitride semiconductor is that a two-dimensional electron gas (2DEG) with a high concentration and a high mobility is produced at a hetero interface when a hetero structure is formed by suitable material selection. A field effect transistor using the 2DEG as a channel is called as a hetero-structure field effect transistor (HFET). The HFET is focused as a device which has high voltage endurance and low on-resistance characteristics and can exhibit features of the nitride semiconductor to a maximum.

As a basic circuitry element constituting a power conversion circuit, a circuit called as a half bridge generally is known. The half bridge circuit is a circuit having a field effect transistor and a diode connected in reverse-parallel to the field effect transistor. In the half bridge circuit, the field effect transistor and the diode are connected in series. Various kinds of inverter circuits are realized by using a single piece of half bridge circuit or by using a plurality of half bridge circuits connected in parallel with each other.

The field effect transistor of the half bridge circuit performs a switching operation according to a signal which is input to a gate, and controls power supply from a power supply terminal to a load connected to a load connection terminal. The diode connected in reverse-parallel to the field effect transistor is generally called as a wheeling diode, and is provided to prevent breakdown of the field effect transistor by feedback power which is produced mainly in a case of using a coil load in a process of power control. Accordingly, a basic inverter circuit is usually provided with such a field effect transistor and a diode which compose a pair.

With regard to a nitride semiconductor, it is difficult to obtain a low-priced stand-alone substrate having a large diameter (4 inches or more) as that of silicon. For this reason, a substrate for the use of a semiconductor device of nitride is generally obtained by growing a nitride semiconductor on a sapphire substrate or a silicon substrate through hetero-epitaxial growth.

Since a substrate on which a crystalline nitride layer is formed may use a low-priced silicon substrate having a large diameter, it is possible to obtain the substrate at a relatively low price.

However, it is necessary to use an advanced and complicated technology to obtain a hetero-epitaxial crystal of high quality. Thus, even when such a substrate is used, an influence of increasing in an area which is occupied by the semiconductor device of nitride on a device cost is remarkable high as compared with a silicon device.

Accordingly, there is a need for a technology to integrate a field effect transistor and a diode to be connected in reverse-parallel to the field effect transistor with as little increase of area to be occupied by a device including the transistor and the diode as possible.

DETAILED DESCRIPTION

Figure 1:
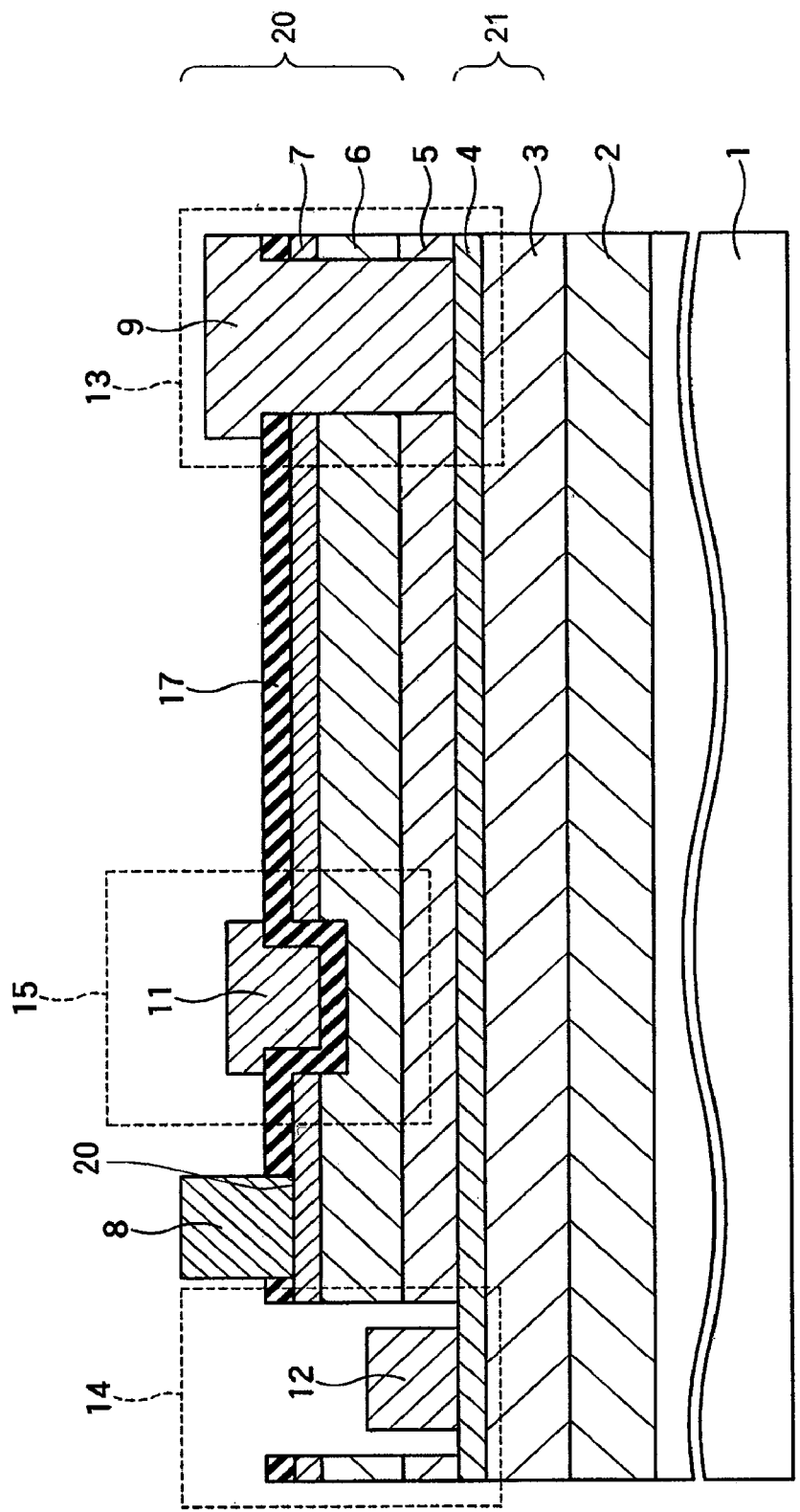
FIG. 1 is a schematic cross-sectional view illustrating a semiconductor device according to a first embodiment.

One embodiment provides a semiconductor device having a first nitride semiconductor layer, a second nitride semiconductor layer, a third nitride semiconductor layer, a fourth nitride semiconductor layer, a fifth nitride semiconductor layer, a first electrode, a second electrode, a third electrode and a gate electrode. The second nitride semiconductor layer is provided on the first nitride semiconductor layer and has a band gap wider than that of the first nitride semiconductor layer. The third nitride semiconductor layer is provided above the second nitride semiconductor layer. The fourth nitride semiconductor layer is provided on the third nitride semiconductor layer and has a band gap wider than that of the third nitride semiconductor layer. The fifth nitride semiconductor layer is provided between the second nitride semiconductor layer and the third nitride semiconductor layer to insulate the second nitride semiconductor layer and the third nitride semiconductor layer from each other. The first electrode is in contact with the second nitride semiconductor layer, the third nitride semiconductor and the fourth nitride semiconductor layer. The second electrode is provided on the fourth nitride semiconductor layer. The gate electrode is provided between the first electrode and the second electrode on a gate insulating layer. The third electrode is in contact with the second nitride semiconductor layer and is provided so that the second electrode is between the third electrode and the gate electrode.

The first electrode is formed in a first opening extending from the third semiconductor layer to the fourth semiconductor layer so as to form an ohmic junction with the first to the third semiconductor layers.

The second electrode is provided on the third semiconductor layer to form an ohmic junction with the third semiconductor layer.

The gate electrode is provided between the first electrode and the second electrode.

The third electrode forms a Schottky junction with the first semiconductor layer. The third electrode is provided so that the second electrode is interposed between the third electrode and the gate electrode. The third electrode is provided in a second opening extending from the second semiconductor layer to the fourth semiconductor layer.

Hereinafter, further embodiments will be described with reference to the drawings. In the drawings, the same reference numerals denote the same or similar portions respectively.

In a first embodiment, a source electrode of a hetero-structure field effect transistor (hereinafter referred to as "HFET") and an anode electrode of a Schottky barrier diode ((hereinafter referred to as "SBD") are provided so as to be spaced apart from each other. In a second embodiment, a source electrode of a HFET and an anode electrode of a SBD are integrally provided.

FIG. 1 is a schematic cross-sectional view illustrating a semiconductor device according to a first embodiment.

As shown in FIG. 1, a semiconductor device according to the embodiment is provided with a semiconductor substrate (a silicon substrate) 1, a buffer layer 2, semiconductor layers 3 to 7 of nitride stacked one after another on the buffer layer 2, a gate insulating layer 17, a source electrode 8, an electrode 9, a gate electrode 11, and an anode electrode 12. The electrode 9 serves as both a drain electrode and a cathode electrode, The semiconductor device according to the embodiment may be divided into an HFET portion 20 composed of an HFET and a diode portion 21 composed of an SBD.

The HFET portion 20 includes the semiconductor layers above the semiconductor layer 5 i.e. the semiconductor layers 6, 7, the source electrode 8, the electrode 9, and the gate electrode 11. The diode portion 21 includes the semiconductor layers below the semiconductor layer 5 i.e. the semiconductor layers 3, 4, the anode electrode 12, and the electrode 9.

The HFET portion 20 uses a two-dimensional electron gas (hereinafter referred to as "2DEG") of high mobility which is produced at an interface between the semiconductor layer 6 and the semiconductor layer 7, as a channel. The diode portion 21 uses 2DEG which is produced at an interface between the semiconductor layer 3 and the semiconductor layer 4. Since the diode portion 21 uses the 2DEG of high mobility, voltage drop of the SBD in a forward direction can be reduced. The semiconductor layer 4 may be omitted.

Hereinafter, each constituent part of the semiconductor device will be described in detail.

The buffer layer 2 is a layer which is provided for the purpose of stacking a high quality semiconductor layer on the semiconductor substrate 1 while relaxing stress and reducing crystal defect and dislocation. The buffer layer 2 may be composed of one kind of nitride semiconductor such as AlGaN, or a multi-layered structure such as AlGaN/GaN or AlN/GaN which is composed of multiple kinds of thin nitride semiconductor layers stacked alternately.

The semiconductor layer 3 is provided on the buffer layer 2. The semiconductor layer 3 is composes of an undoped nitride semiconductor, for example, GaN. The semiconductor layer 3 may be provided directly on the semiconductor substrate 1 rather than via the buffer layer 2.

The semiconductor layer 4 is provided on the semiconductor layer 3 and has a band gap wider than that of the semiconductor layer 3. The semiconductor layer 4 is composes of an undoped or n-type nitride semiconductor, for example, AlGaN.

The semiconductor layer 6 is provided over the semiconductor layer 4 and so as to face the semiconductor layer 4 spaced-apart from the semiconductor layer 4. The semiconductor layer 6 is composed of an undoped nitride semiconductor, for example, GaN.

The semiconductor layer 7 is provided on the semiconductor layer 6 and has a band gap wider than that of the semiconductor layer 6. The semiconductor layer 7 is composed of an undoped or n-type nitride semiconductor, for example, AlGaN.

The semiconductor layer 5 is provided between the semiconductor layer 4 and the semiconductor layer 6, and insulates the semiconductor layer 4 and semiconductor layer 6 from each other. The semiconductor layer 5 serves as a element isolation layer to insulate the HFET portion 20 and the diode portion 21 from each other. The main role of the semiconductor layer 5 is to prevent short circuit between the source electrode 8 and the 2DEG of the diode portion 21.

The semiconductor layer 5 is composed of an undoped AlN, for example. More specifically, the semiconductor layer 5 is composed of an undoped nitride semiconductor having a band gap wider than those of the semiconductor layers 4, 6.

The semiconductor layer 5 may be composed of a p-type nitride semiconductor, for example, GaN, InAlN, or AlGaN. By using the p-type nitride semiconductor, the semiconductor layer 5 shows low lattice mismatch with the semiconductor 4. Thus, the semiconductor layer 5 may be formed thick to enhance insulation performance. Further, since the semiconductor layer 5 attracts the two-dimensional electron gas produced at the interface between the semiconductor layers 6, 7, the threshold voltage of the HFET of the HFET portion 20 can be increased.

The electrode 9 serves as both the drain electrode of the HFET and the cathode electrode of the SBD. As shown in FIG. 1, the electrode 9 is provided to fill an opening 13 penetrating the semiconductor layers 5 to 7, and forms an ohmic junction with the semiconductor layers 4, 6, and 7. The electrode 9 is provided from a position above the gate insulating layer 17 to an interface between the semiconductor layers 4, 5 in a thickness direction.

The source electrode 8 composes the HFET, and is provided on the semiconductor layer 7 to fill an opening 20 of the gate insulating layer 17 so as to form an ohmic junction with the semiconductor layer 7.

The source electrode 8 and the electrode 9 have a two-layered structure of a titanium (Ti) layer and an aluminum (Al) layer, for example, respectively.

The gate electrode 11 composes the HFET, and is provided between the electrode 9 and the source electrode 8. The gate electrode 11 controls a concentration of the 2DEG produced at the interface between the semiconductor layer 6 and the semiconductor layer 7.

In the embodiment, as shown in FIG. 1, a portion of the semiconductor layer 7 and a portion of the semiconductor layer 6 are removed, and an opening 15 is formed. The opening 15 penetrates the semiconductor layer 7 and extends to an intermediate position of the semiconductor layer 6 in the thickness direction. The gate insulating layer 17 is formed from the opening 15 so as to cover the semiconductor layer 7. The gate electrode 11 is provided to fill the opening 15. In other words, the gate insulating layer 17 is provided to cross an imaginary surface extending from a boundary between the semiconductor layer 6 and the semiconductor layer 7 laterally. Accordingly, since the semiconductor layer 7 is not present below the gate electrode 11, the 2DEG is not produced below the gate electrode 11. Accordingly, the HFET is a normally-off type transistor which is normally required for use in an inverter. The gate electrode 11 may be composed of a metal containing nickel (Ni) as a main constituent.

The anode electrode 12 composes the SBD. The anode electrode 12 is provided in an opening 14 and forms a Schottky junction with the semiconductor layer 4. The opening 14 is formed so as to interpose the source electrode 8 between the opening 14 and the gate electrode 11. Further, the opening 14 penetrates the semiconductor layers 5 to 7. The anode electrode 12 may be composed of a metal containing nickel (Ni) as a main constituent. The anode electrode 12 is formed on a portion of the semiconductor layer 4 exposed to a bottom of the opening 14, and is provided so as not to be in contact with an inner side of the opening 14.

As described above, in the embodiment, the HFET portion 20 constituting the HFET and the diode portion 21 constituting the SBD are formed above and below the semiconductor layer 5 serving as the device isolation layer, respectively. In addition, the electrode 9 serves as the drain electrode and the cathode electrode, and the anode electrode 12 is provided so that the source electrode is interposed between the gate electrode 11 and the anode electrode 12d. Accordingly, it is possible to integrate the field effect transistor and the diode connected in reverse-parallel to the field effect transistor without significant increase in device area. According to the embodiment, it is possible to provide a semiconductor device occupying a smaller area in which the field effect transistor and the diode are formed.

In order to provide conduction between the anode and cathode of the diode portion 21, an n-type nitride semiconductor may be used instead of using the 2DEG. Instead of the undoped semiconductor layers 3, 4, at least one semiconductor layer of n-type GaN may be provided. At least one semiconductor layer to be provided on the buffer layer 2 may be a layer composed of a nitride semiconductor which has conductivity at least in a horizontal direction.

A method of manufacturing the semiconductor device illustrated in FIG. 1 will be described with reference to FIGS. 2A to 2E.

Figure 2A:
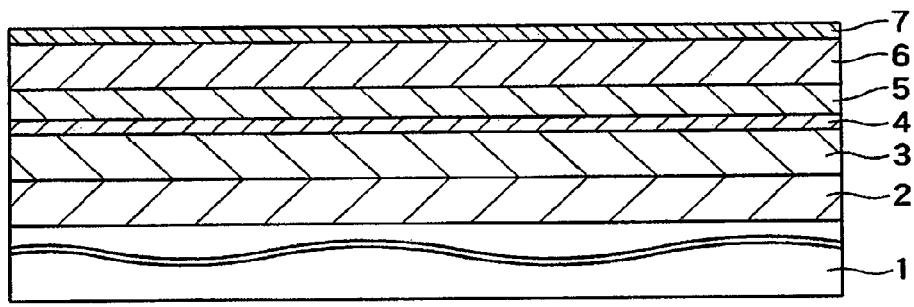
FIGS. 2A to 2E are cross-sectional views in respective steps of a method of manufacturing the semiconductor device according to the first embodiment.

As shown in FIG. 2A, semiconductor layers 3 to 7 of nitride are sequentially stacked directly on a semiconductor substrate 1 or on the semiconductor substrate 1 via a buffer layer 2. By the stacking, an epitaxial wafer including the semiconductor layers 3 to 7 is obtained.

Figure 2B:
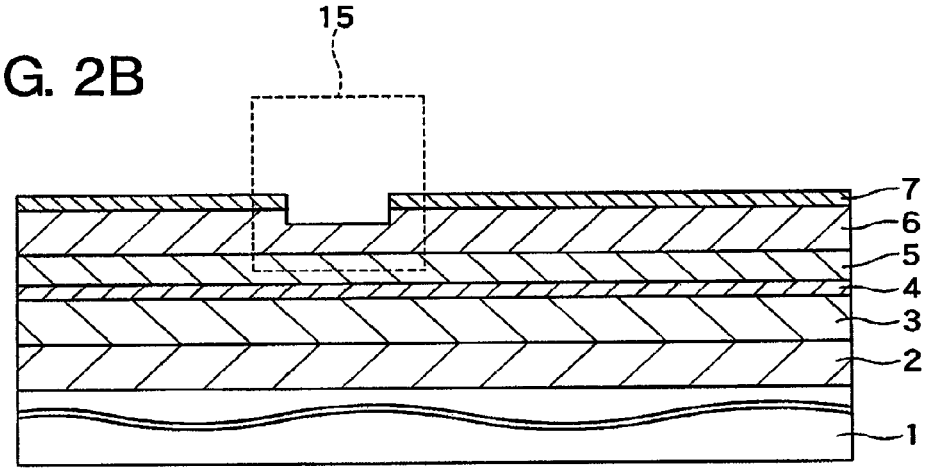

A photoresist layer (not shown) having a predetermined pattern is formed on the semiconductor layer 7 using a lithography technology. A portion of the semiconductor layer 7 is etched using the photoresist layer as a mask. A portion of the semiconductor layer 6 is also etched to some extent in a depth direction. Accordingly, as shown in FIG. 2B, an opening 15 is formed. A portion of the semiconductor layer 6 is exposed to a bottom of the opening 15. The etching is performed by a dry etching using a chlorine-based gas such as $Cl_2$. The etching time is adjusted so that the portion of the semiconductor layer 6 is exposed to the bottom of the opening 15. The photoresist layer is removed after the etching.

Figure 2C:
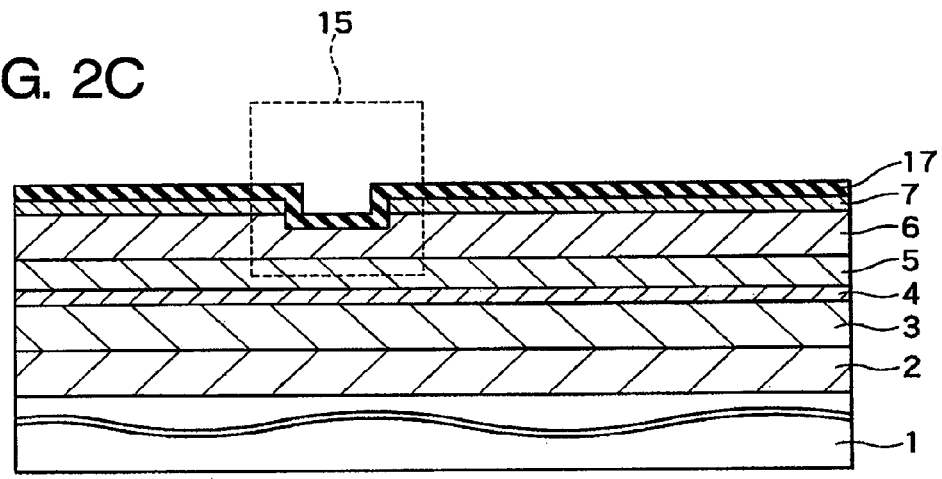

As shown in FIG. 2C, a gate insulating layer 17 is formed to cover a surface of the semiconductor layer 7, and the bottom and an inner side of the opening 15. A material for forming the gate insulating layer 17 may be $SiO_2$. A method of forming the gate insulating layer 17 may be a plasma chemical vapor deposition (CVD) method or a low pressure CVD (LPCVD) method.

Figure 2D:
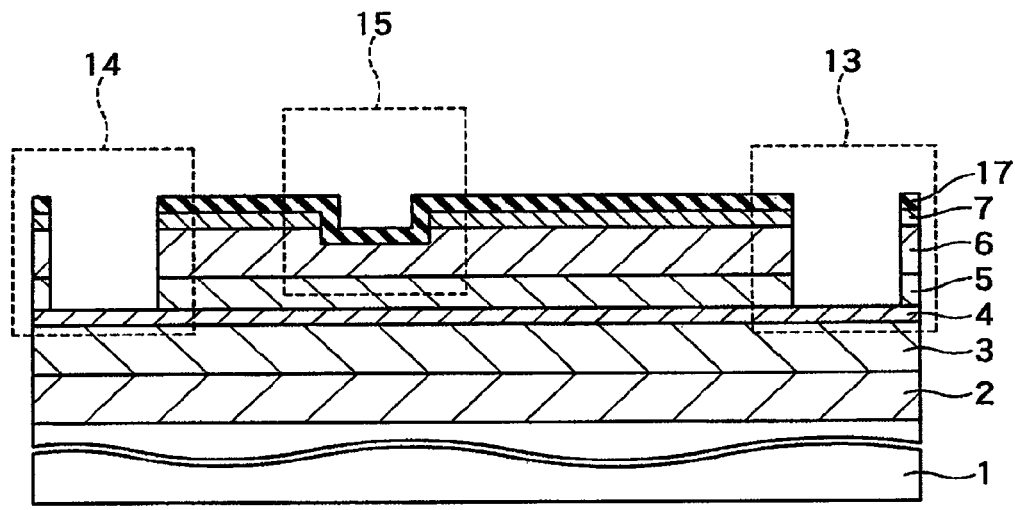

A photoresist layer (not shown) having a predetermined pattern is formed on the gate insulating layer 17 using a lithography technology, and then the gate insulating layer 17 is selectively etched using the photoresist layer as a mask. As a result, as shown in FIG. 2D, openings 13, 14 are formed by the etching. Portions of the semiconductor layer are exposed to bottoms of the openings 13, 14. The etching may be performed by a dry etching using a chlorine-based gas such as $Cl_2$, similarly to the etching of the opening 15. The etching time is adjusted so that the semiconductor layer 4 is exposed to the bottoms of the openings 13, 14. After the etching, the photoresist layer is removed.

Figure 2E:
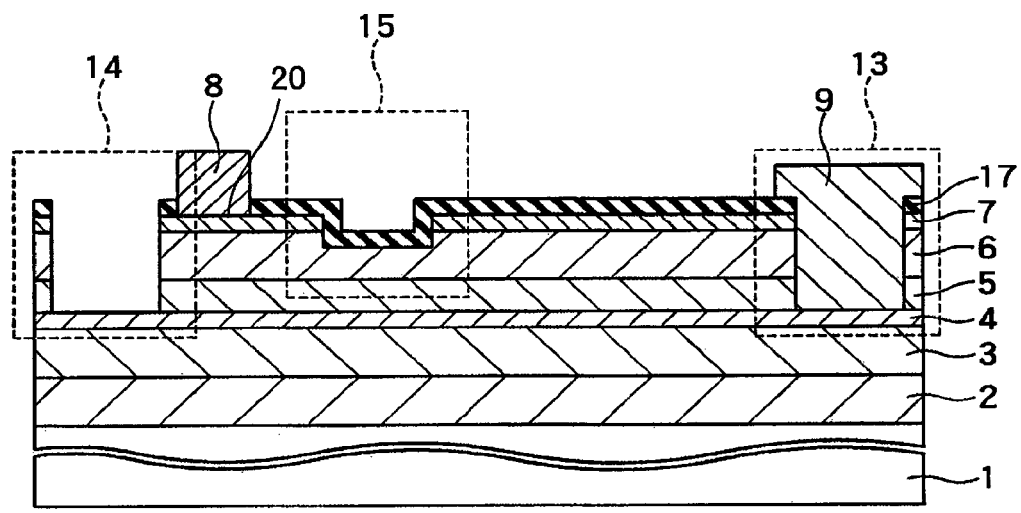

As shown in FIG. 2E, a portion of the gate insulating layer 17 is selectively etched to form an opening 20 between the opening 14 and the opening 15. An electrode 9 is formed to fill the opening 13, and a source electrode 8 is formed on the semiconductor layer 7 to fill the opening 20. The electrode 9 and the source electrode 8 are simultaneously formed using an electrode forming method using a lift-off, for example. The electrode 9 and the source electrode 8 are composed of a metal having a relatively low work function to form an ohmic junction. The electrode 9 and the source electrode 8 have a stacked structure of Ti/Al/Ni/Au, for example.

An annealing process is performed for the electrode 9 and the source electrode 8. By the annealing process, ohmic junctions between the electrode 9 and each of the semiconductor layers 4, 6, 7 and between the source electrode 8 and the semiconductor layer 7 is formed. The annealing process is performed under a temperature condition of 600° C. for 1 minute, for example,.

Further, as shown in FIG. 1, a gate electrode 11 is formed on the gate insulating layer 17 to fill the opening 15, and an anode electrode 12 is simultaneously formed on the portion of the semiconductor layer 4 exposed to the bottom of the opening 14. The gate electrode 11 and the anode electrode 12 are simultaneously formed by an electrode formation method using a lift-off. The anode electrode 12 is composed of a metal having a relatively low work function to form a Schottky junction, and has a stacked structure of nickel (Ni) and gold (Au), for example.

The semiconductor device illustrated in FIG. 1 is manufactured through the above-described steps. As described above, the gate electrode 11 and anode electrode 12 are formed after the electrode 9 and source electrode 8 serving as ohmic electrodes are formed. According to the manufacturing method, it is possible to maintain Schottky junction without performing an annealing process after the gate electrode 11 and the anode electrode 12 are formed.

Figure 3:
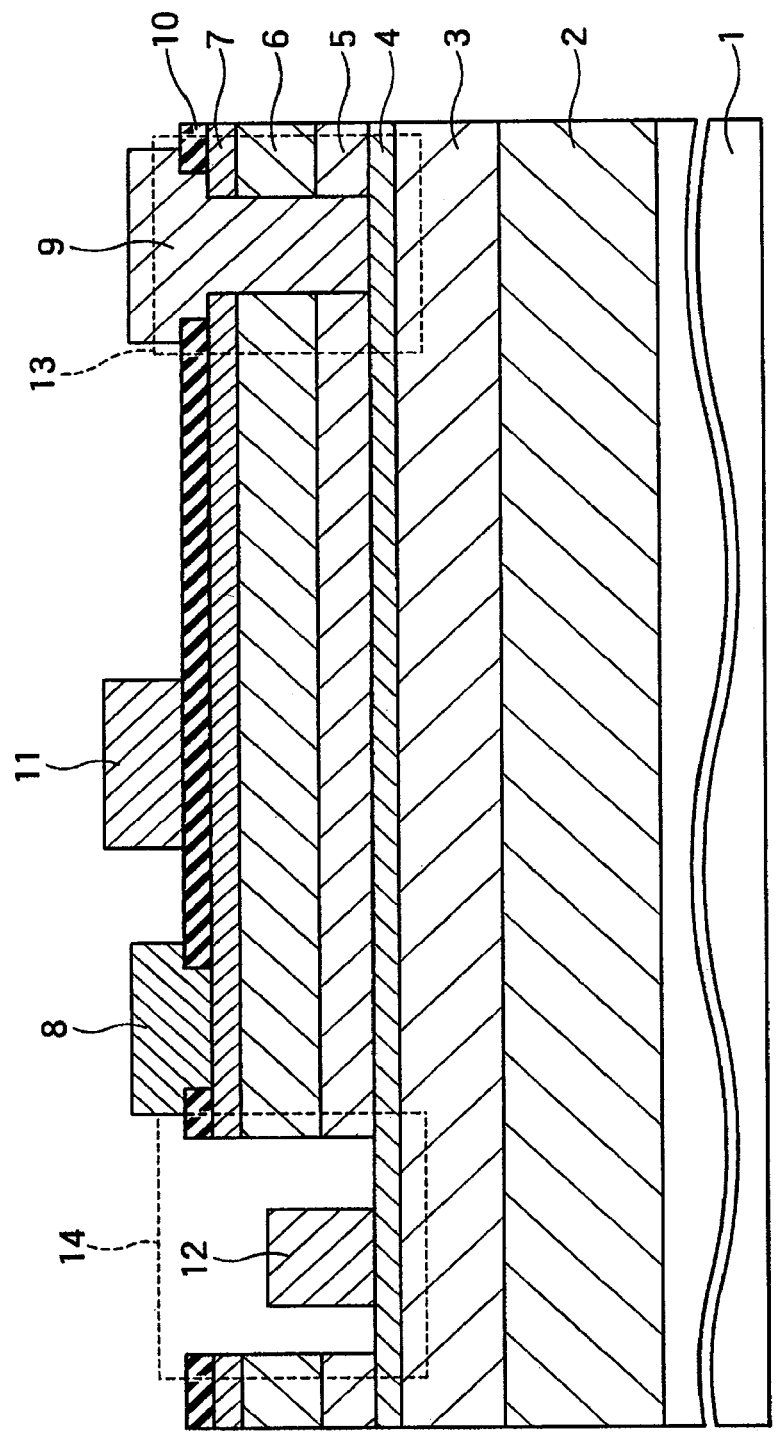
FIG. 3 is a schematic cross-sectional view illustrating a semiconductor device according to a modification of the first embodiment.

In the embodiment, the HFET is a normally-off type. However, the HFET may be configured as a normally-on type. FIG. 3 illustrates a schematic cross-sectional view of a normally-on-type semiconductor device according to a modification of the embodiment. One difference between the semiconductor devices of FIGS. 1, 3 is the configuration of the gate electrode and the circumferential portion. In the modification, a gate electrode 11 is provided on a substantially flat gate insulating layer 10 formed on a semiconductor layer 7. For example, the gate insulating layer 10 is composed of SiN. The semiconductor device is mainly configured as a normally-off type even when the gate electrode 11 is formed directly on the semiconductor layer 7. When the normally-off operation is required, it is sufficient that a normally-off-type silicon (Si) MOSFET having low voltage endurance is inserted between the source electrode 8 and the anode electrode 12 to form a cascode connection. Even with regard to the modification, the same advantages as those of the first embodiment may be obtained.

A semiconductor device according to a second embodiment will be described. In the second embodiment, an anode electrode of an SBD and a source electrode of an HFET are integrally provided. According to this configuration, it is possible to suppress increase of device area and to integrate a field effect transistor and a diode connected in reverse-parallel to the field effect transistor.

Figure 4:
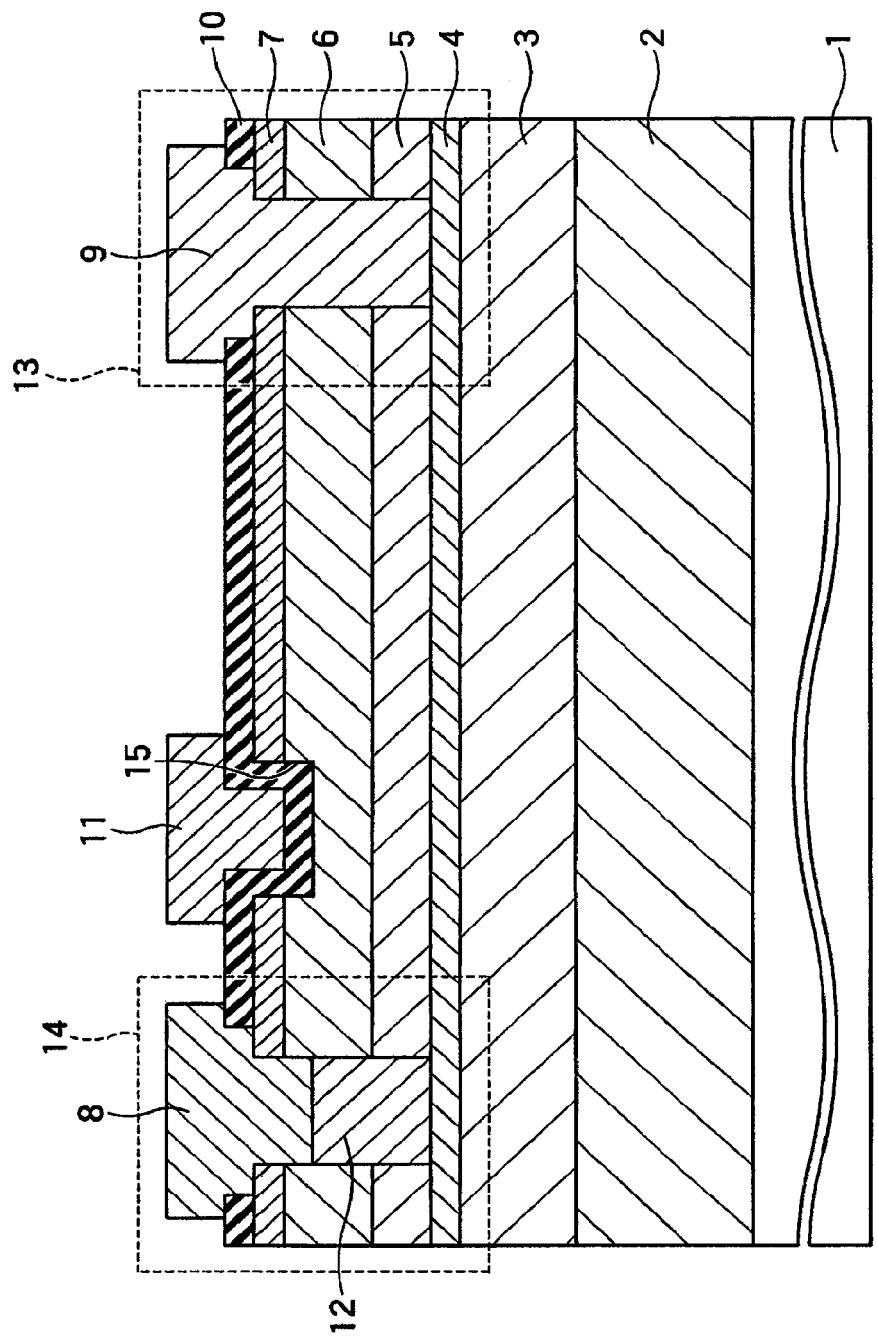
FIG. 4 is a schematic cross-sectional view illustrating a semiconductor device according to a second embodiment.

FIG. 4 is illustrates a schematic cross-sectional view of the semiconductor device according to the second embodiment.

As shown in FIG. 4, a semiconductor device according to the embodiment is provided with a semiconductor substrate (a silicon substrate) 1, a buffer layer 2, semiconductor layers 3 to 7 sequentially stacked on the buffer layer 2, a source electrode 8, an electrode 9, a gate electrode 11, and an anode electrode 12. The electrode 9 serves as both a drain electrode and a cathode electrode.

As shown in FIG. 4, the anode electrode 12 is formed from a bottom of an opening 14 to an intermediate position of the opening 14 in a depth direction, and is in contact with an inner side of the opening 14.

The anode electrode 12 is provided to fill the opening 14 upward to the intermediate position of the opening 14, and forms a Schottky junction with the semiconductor layer 4. In other words, the anode electrode 12 is provided from a surface of the semiconductor layer 4 to the intermediate position of the semiconductor layer 6 in a thickness direction.

The source electrode 8 is formed to cover the opening 14 and is in contact with the anode electrode 12 and the semiconductor layer 7. The source electrode 8 is provided to fill the opening 14 upward from an exposed top surface of the anode electrode 12, and forms an ohmic junction with the semiconductor layer 7. In this way, the source electrode 8 is provided on the anode electrode 12.

In the second embodiment, it is necessary for the HFET to be configured as a normally-off type. Accordingly, as shown in FIG. 4, the gate electrode 11 is provided to fill an opening 15 which penetrates the semiconductor layer 7 and reaches an intermediate position of the semiconductor layer 6 in the thickness direction. Further, a portion of the gate insulating layer 10 is interposed between the gate electrode 11 and an opening 15. The gate insulating layer 10 crosses an imaginary surface extended from a boundary between the semiconductor layers 6, 7 laterally. Since a portion of the semiconductor layer 7 is not present below the gate electrode 11, a 2DEG is not produced below the gate electrode 11, and thus the HFET is configured as a normally-off type.

As described above, in the second embodiment, since the source electrode 8 is integrally provided on the anode electrode 12, it is possible to suppress increase of device area. As a result, it is further possible to provide a device having a smaller device area in which a field effect transistor and a diode connected in reverse-parallel to the field effect transistor are arranged.

First and second modifications according to the second embodiment will be described. The first and second modifications may have the same advantages as those of the second embodiment.

Figure 5:
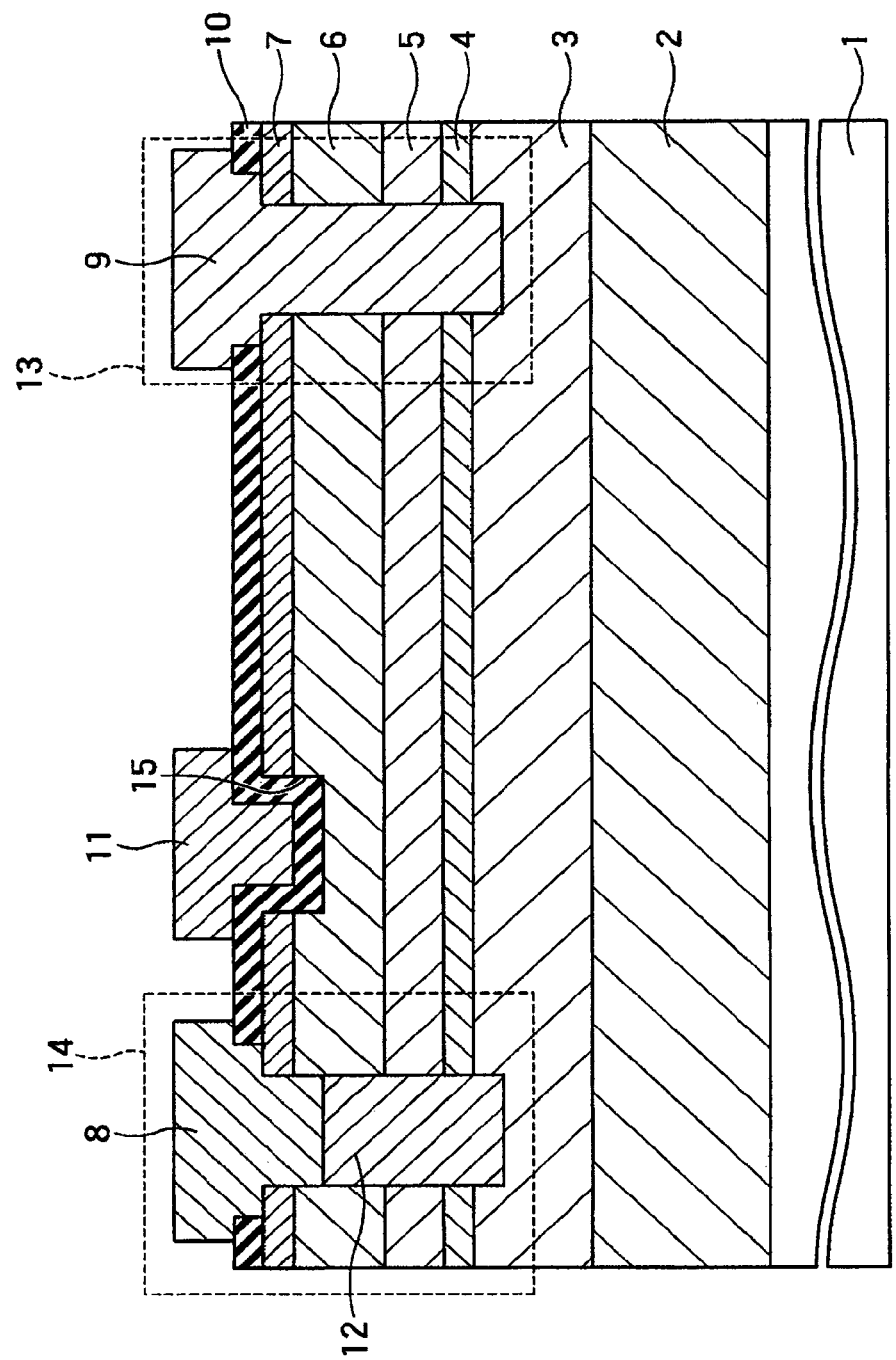
FIG. 5 is a schematic cross-sectional view illustrating a semiconductor device according to a first modification of the second embodiment.

A semiconductor device according to the first modification will be described with reference to FIG. 5. FIG. 5 is a schematic cross-sectional view of the semiconductor device according to the modification.

One difference between the modification and the second embodiment is the configuration of the gate electrode and the anode electrode. As shown in FIG. 5, openings 13, 14 are formed to penetrate a semiconductor layer 4 and reach an intermediate position of a semiconductor layer 3 in a thickness direction.

An electrode 9 is formed to extend to the intermediate position of the semiconductor layer 3 in the thickness direction. A bottom of the electrode 9 and a portion of an outer side surface of the electrode 9 are in contact with the semiconductor layer 3 so that the electrode 9 forms an ohmic junction with the semiconductor layer 3. The anode electrode 12 extends from an intermediate position of a semiconductor layer 6 in a thickness direction to the intermediate position of the semiconductor layer 3 in the thickness direction. A bottom of the anode electrode 12 and a portion of an outer side surface of the anode electrode 12 are in contact with the semiconductor layer 3 so that the anode electrode 12 forms a Schottky junction with the semiconductor layer 3.

According to the modification, it is possible to lower an on-voltage of an SBD.

Figure 6:
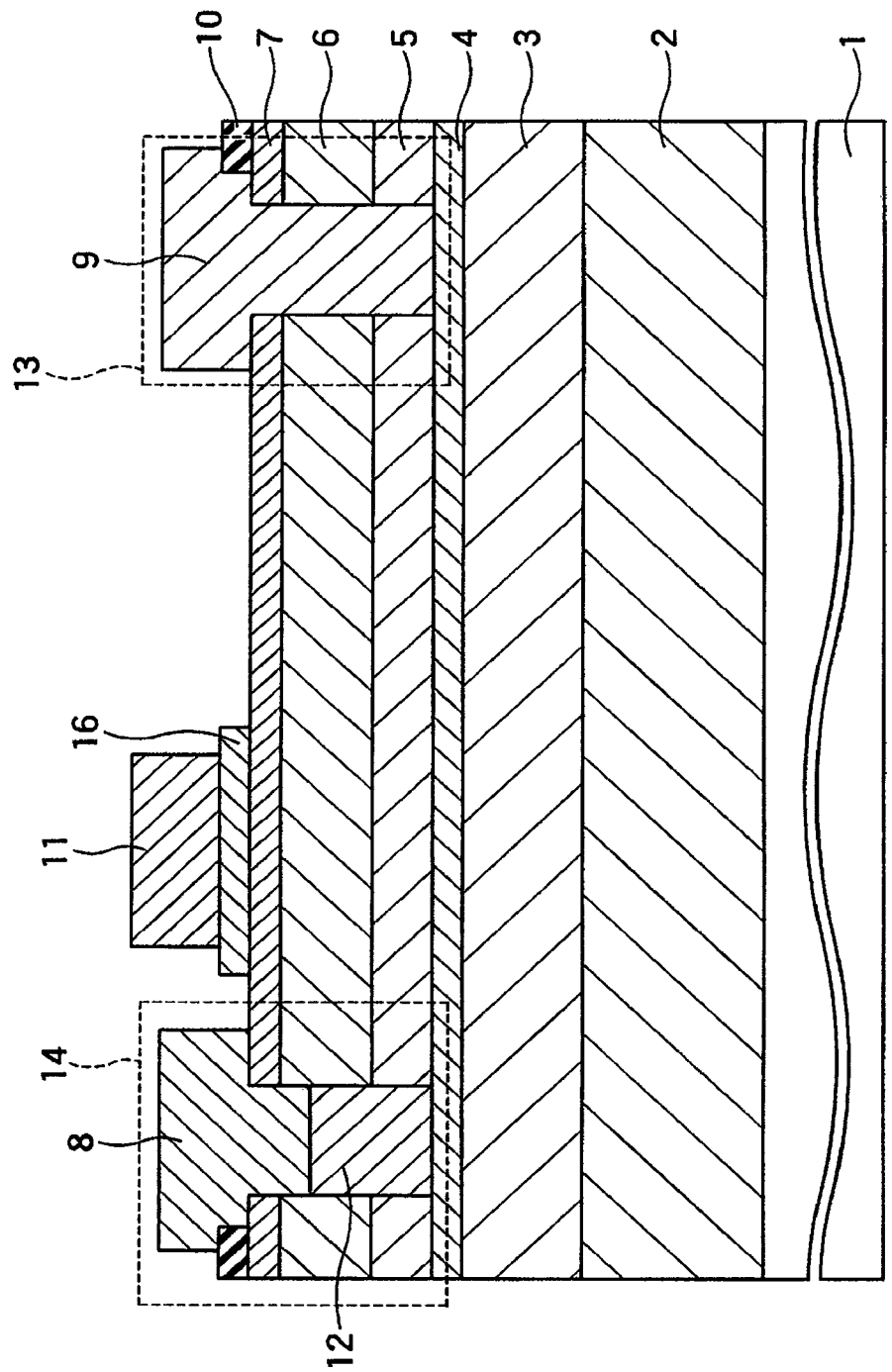
FIG. 6 is a schematic cross-sectional view illustrating a semiconductor device according to a second modification of the second embodiment.

A semiconductor device according to the second modification will be described with reference to FIG. 6. FIG. 6 is a schematic cross-sectional view of the semiconductor device according to the modification.

One difference between the modification and the second embodiment is the configuration of the gate electrode and the circumferential portion. As shown in FIG. 6, an opening corresponding to the opening 15 illustrated in FIG. 4 is not formed. A gate electrode 11 is provided on a p-type semiconductor layer 16 formed on a semiconductor layer 7. The p-type semiconductor layer 16 is composed of p-type GaN or p-type AlGaN, for example.

In the modification, the p-type semiconductor layer 16 is provided between the gate electrode 11 and the semiconductor layer 7, and thus a built-in potential is produced between the semiconductor layer 7 and the semiconductor layer 16. Accordingly, it is possible that a HFET of the semiconductor device is configured as a normally-off type.

Further, according to the modification, since the mobility of a 2DED produced at an interface between a semiconductor layer 6 and the semiconductor layer 7 can be maintained at a high level, it is possible to reduce on-resistance of the HFET.

The two modifications of the second embodiment described above may be applied to the semiconductor device according to the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
a first nitride semiconductor layer;
a second nitride semiconductor layer provided on the first nitride semiconductor layer and having a band gap wider than that of the first nitride semiconductor layer;
a third nitride semiconductor layer provided above the second nitride semiconductor layer;
a fourth nitride semiconductor layer provided on the third nitride semiconductor layer and having a band gap wider than that of the third nitride semiconductor layer;
a fifth nitride semiconductor layer provided between the second nitride semiconductor layer and the third nitride semiconductor layer to insulate the second nitride semiconductor layer and the third nitride semiconductor layer from each other;
a first electrode being in contact with the second nitride semiconductor layer, the third nitride semiconductor and the fourth nitride semiconductor layer;
a second electrode provided on the fourth nitride semiconductor layer;
a gate electrode provided on a gate insulating layer between the first electrode and the second electrode; and
a third electrode being contact with the second nitride semiconductor layer, the third electrode being provided so that the second electrode is between the third electrode and the gate electrode.

2. The device according to claim 1, wherein the first electrode forms an ohmic junction with the second nitride semiconductor layer, the third nitride semiconductor and the fourth nitride semiconductor layer.

3. The device according to claim 1, wherein the first electrode includes titanium and aluminum.

4. The device according to claim 1, wherein the second electrode forms an ohmic junction with the fourth nitride semiconductor layer.

5. The device according to claim 1, wherein the second electrode includes titanium and aluminum.

6. The device according to claim 1, wherein the third electrode forms a Schottky junction with the second nitride semiconductor layer.

7. The device according to claim 1, wherein the third electrode includes nickel.

8. The device according to claim 1, wherein the fifth nitride semiconductor layer is composed of an undoped nitride semiconductor having a band gap wider than those of the first and second semiconductor layers.

9. The device according to claim 1, wherein the fifth semiconductor layer is composed of a p-type nitride semiconductor.

10. The device according to claim 1, further comprising a gate insulating layer provided between the gate electrode and the third nitride semiconductor layer.

11. The device according to claim 1, wherein the gate electrode is provided on a p-type semiconductor layer formed on the fourth semiconductor layer.

12. A semiconductor device, comprising:
a first nitride semiconductor layer;
a second nitride semiconductor layer provided on the first nitride semiconductor layer and having a band gap wider than that of the first nitride semiconductor layer;
a insulating layer provided on the second nitride semiconductor;
a third nitride semiconductor layer provided on the insulating layer;
a fourth nitride semiconductor layer provided on the third nitride semiconductor layer and having a band gap wider than that of the third nitride semiconductor layer;
a first electrode being in contact with the second nitride semiconductor layer, the third nitride semiconductor and the fourth nitride semiconductor layer;
a second electrode provided on the fourth nitride semiconductor layer;
a gate electrode provided between the first electrode and the second electrode on a gate insulating layer; and
a third electrode being in contact with second nitride semiconductor layer, the third electrode being provided so that the second electrode is between the third electrode and the gate electrode.

13. The device according to claim 12, wherein the first electrode and the second electrode include titanium and aluminum.

14. The device according to claim 12, wherein the third electrode includes nickel.

15. The device according to claim 12, wherein the insulating layer is composed of an undoped nitride semiconductor having a band gap wider than those of the first and second semiconductor layers.

16. The device according to claim 12, wherein the insulating layer is composed of a p-type nitride semiconductor.

17. The device according to claim 12, wherein the gate insulating layer is provided between the gate electrode and the third nitride semiconductor layer.

18. A semiconductor device, comprising:
a first nitride semiconductor layer;
a second nitride semiconductor layer provided on the first nitride semiconductor layer and having a band gap wider than that of the first nitride semiconductor layer;
a third nitride semiconductor layer provided above the second nitride semiconductor layer;
a fourth nitride semiconductor layer provided on the third nitride semiconductor layer and having a band gap wider than that of the third nitride semiconductor layer;
a fifth nitride semiconductor layer provided between the second nitride semiconductor layer and the third nitride semiconductor layer to insulate the second nitride semiconductor layer and the third nitride semiconductor layer from each other;
a first electrode being in contact with the second nitride semiconductor layer, the third nitride semiconductor and the fourth nitride semiconductor layer;
a second electrode being in contact with the second nitride semiconductor layer and the third nitride semiconductor;
a third electrode being in contact with the second electrode and the fourth nitride semiconductor; and a gate electrode provided between the first electrode and the third electrode.

19. The device according to claim 18, further comprising a gate insulating layer provided between the gate electrode and the third nitride semiconductor layer.

20. The device according to claim 18, wherein the gate electrode is provided on a p-type semiconductor layer formed on the fourth semiconductor layer.

* * * * *